United States Patent
Soupremanien et al.

(10) Patent No.: US 10,867,883 B2
(45) Date of Patent: Dec. 15, 2020

(54) DBC STRUCTURE USING A SUPPORT INCORPORATING A PHASE CHANGE MATERIAL

(71) Applicant: Commissariat A L'Energie Atomique et aux Energies Alternatives, Paris (FR)

(72) Inventors: Ulrich Soupremanien, Saint Marcellin (FR); Emmanuel Ollier, Grenoble (FR); Sebastien Quenard, Le Sappey en Chartreuse (FR); Maryline Roumanie, Coublevie (FR); Helga Szambolics, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 376 days.

(21) Appl. No.: 15/283,827

(22) Filed: Oct. 3, 2016

(65) Prior Publication Data
US 2017/0103936 A1   Apr. 13, 2017

(30) Foreign Application Priority Data
Oct. 9, 2015   (FR) ...................................... 15 59632

(51) Int. Cl.
*F28D 20/02* (2006.01)
*H01L 21/48* (2006.01)
(Continued)

(52) U.S. Cl.
CPC ........ *H01L 23/3735* (2013.01); *F28D 20/021* (2013.01); *H01L 21/4871* (2013.01);
(Continued)

(58) Field of Classification Search
CPC . H01L 23/3735; H01L 21/4871; H01L 21/48; H01L 2224/48472; H01L 23/34;
(Continued)

(56) References Cited

U.S. PATENT DOCUMENTS 5,831,831 A    11/1998 Freeland
2002/0033247 A1*  3/2002 Neuschutz .............. F28D 20/02
                                                         165/10

(Continued)

FOREIGN PATENT DOCUMENTS

DE    10 2010 041 714 A1    8/2011

OTHER PUBLICATIONS ("Surround." Merriam-Webster, Merriam-Webster, www.merriam-webster.com/dictionary/surround, 2020 (Year: 2020).*

(Continued)

*Primary Examiner* — Lee E Sanderson
*Assistant Examiner* — Michael C Romanowski
(74) *Attorney, Agent, or Firm* — Oblon, McClelland, Maier & Neustadt, L.L.P.

(57) ABSTRACT

DBC type structure, comprising an insulating support (22) coated with at least one conductive zone (20a) able to receive an electronic device, the conductive zone (20a) being in contact with the support (22), the insulating support incorporating means for thermal smoothing of the heat peak released by the component, these means comprising a cavity filled with a phase change material.

12 Claims, 6 Drawing Sheets

(51) Int. Cl.
*H01L 23/00* (2006.01)
*H01L 23/367* (2006.01)
*H01L 23/373* (2006.01)
*H05K 7/20* (2006.01)
*H01L 23/427* (2006.01)

(52) U.S. Cl.
CPC ...... *H01L 21/4882* (2013.01); *H01L 23/3672* (2013.01); *H01L 23/427* (2013.01); *H01L 24/48* (2013.01); *H05K 7/2039* (2013.01); *H01L 2224/32225* (2013.01); *H01L 2224/451* (2013.01); *H01L 2224/48227* (2013.01); *H01L 2224/48472* (2013.01); *H01L 2224/73265* (2013.01); *H01L 2924/00014* (2013.01); *H01L 2924/1302* (2013.01); *H01L 2924/13023* (2013.01); *H01L 2924/13055* (2013.01); *H01L 2924/13091* (2013.01)

(58) Field of Classification Search
CPC ..... H01L 23/427; H01L 23/36; H01L 23/373; H01L 23/3672; H01L 23/367; H01L 23/3731; H01L 23/40; H01L 23/42; H01L 23/46; H01L 23/4275; H05K 7/2039; H05K 7/20; H05K 7/20154; H05K 7/2029; H05K 7/20381; F28D 20/021
USPC .................................................. 165/104.21
See application file for complete search history.

(56) References Cited

U.S. PATENT DOCUMENTS

| 2005/0007740 | A1 | 1/2005 | Neuschuetz et al. |
| 2008/0066890 | A1 | 3/2008 | Searls et al. |
| 2011/0308781 | A1* | 12/2011 | O'Riordan .......... H01L 23/3737 165/185 |
| 2012/0048515 | A1 | 3/2012 | Bhunia et al. |
| 2014/0160682 | A1* | 6/2014 | Ben Jamaa ............ H05K 7/205 361/707 |
| 2014/0183699 | A1 | 7/2014 | Dahlstrom |
| 2014/0369005 | A1 | 12/2014 | Gavillet et al. |
| 2015/0282380 | A1* | 10/2015 | De Bock ................. H01L 23/42 361/704 |

OTHER PUBLICATIONS

French Preliminary Search Report dated Jun. 28, 2016 in French Application 15 59632, filed on Oct. 9, 2015 ( with English Translation of Categories of Cited Documents).
Wei-Hsing Tuan et al. "Eutectic bonding of copper to ceramics for thermal dissipation applications—A review", Journal of the European Ceramics Society 34, 2014, 14 pages.

\* cited by examiner

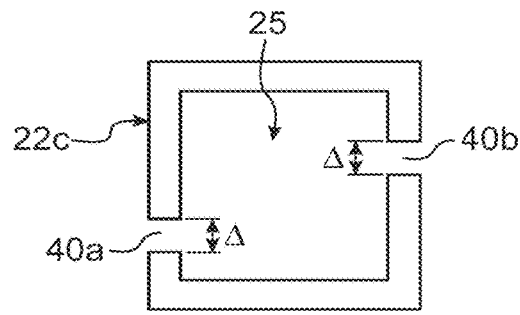
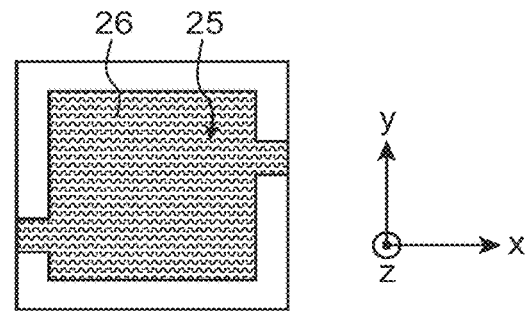
FIG.3A  FIG.3B
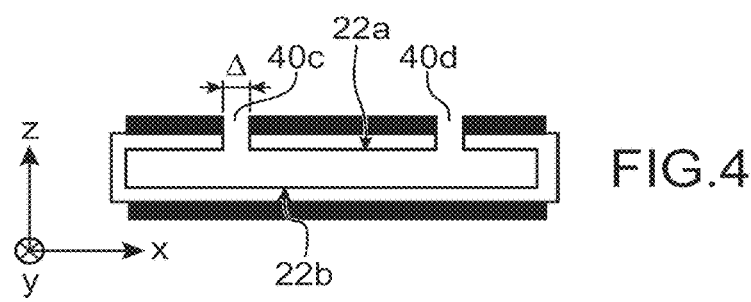
FIG.4
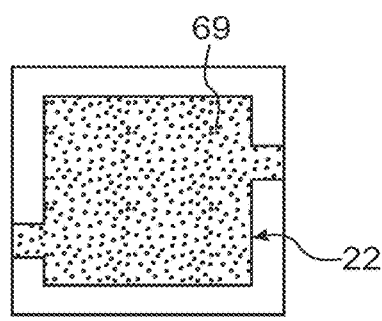
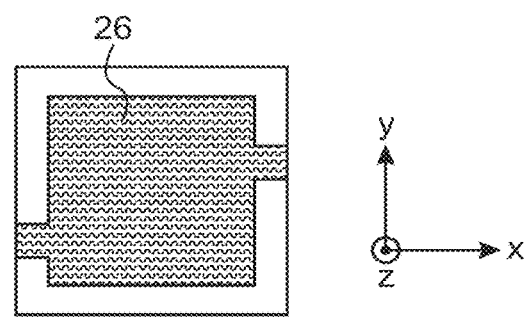
FIG.5A  FIG.5B

DBC STRUCTURE USING A SUPPORT INCORPORATING A PHASE CHANGE MATERIAL

TECHNICAL FIELD AND PRIOR ART

The present application relates to the field of microelectronics and more specifically to structures configured to provide an interconnection for an electronic device and which allow thermal dissipation of the heat generated by this electronic device to be performed.

In power electronics, in order to interconnect an electronic device such as a chip, an integrated circuit or a set of components, the use of DBC ("DIRECT BONDED COPPER") interconnection structures is known, whose role is furthermore to provide electrical insulation of components and to remove the heat generated by the electronic device.

A DBC structure is typically formed of a dielectric material substrate, generally ceramic, on which one or more conductive zones, generally made of copper, are arranged. The substrate may be bound directly to the copper. An electronic device which is to be interconnected, for example a circuit or a chip or a component, and in which overheating must be limited, is then arranged in contact with at least one of the copper zones on a first face of the substrate. A thermal dissipation component is generally placed on the second face of the substrate opposed to the first face.

Document US 2012/0048515 A1, describes a DBC type structure whose upper and lower faces are covered with a first and a second layer of copper respectively.

In order to improve the cooling of a component placed on the first layer of copper on the upper face side of the substrate, a system for dispensing change of state material is provided at the rear face of the structure. This material is delivered in the form of liquid droplets which, when they come into contact with the second layer of copper, are vaporised, which causes the component to cool.

Such a system poses problems of complexity, in its application, of robustness and of overall size.

DESCRIPTION OF THE INVENTION

The proposed invention is intended to overcome these disadvantages.

According to one aspect, the present invention provides a structure, in particular a DBC type structure for connection and dissipation of the heat emitted by an electronic device. This structure comprises an insulating support coated with at least one conductive zone able to receive the electronic device, the conductive zone being in contact with a first face of the support, the insulating support comprising an envelope of dielectric material which defines a cavity filled with a phase change material.

With such a structure, temperature peaks of the electronic device are limited when the latter is operating outside steady state conditions, whilst removing heat when the device is operating in steady state conditions. Such a structure both reduces not only the maximum temperature of the device but also reduces thermal variations. Such a structure increases the operating life of the electronic device, which is in part linked to its resistance to repeated thermal variations.

Such a structure is in addition compact and dissipates heat close to the component, so that the thermal path to be covered between the component that is subject to overheating and the structure allowing the heat to be dissipated is reduced.

The insulating support may be coated with at least one other conductive zone in contact with a second face of the support, opposed to the first face.

The other conductive zone is in turn able to receive a heat dissipation component, for example equipped with fins and/or a fluid system.

Advantageously, inside the cavity the envelope of the dielectric material may be coated with a layer of thermally conductive material, in particular metallic material.

Such a layer may be provided to ensure increased homogeneity of the heat exchanges around the cavity.

Advantageously, the structure also comprises one or more columns which extend into the cavity and are configured to support the envelope of dielectric material.

The electrically insulating support is preferably arranged in such a way that the dielectric material of the envelope extends over the first face, the second face and onto the lateral faces placed between the first face and the second face.

The support thus forms a dielectric envelope or enclosure, providing an enclosed contour around the phase change material. The incorporation of the phase-change material (PCM) can be carried out within a dielectric without a layer of bonding or additional closure being required.

Due to the homogeneous nature of the dielectric material encapsulating the phase change material, any delamination effects are limited.

According to another aspect, the present invention also provides a method for making a structure for connection of and for dissipation of the heat emitted by an electronic device, the structure comprising: a dielectric support coated with at least one conductive zone in contact with a first face of the support, the conductive zone being intended to receive the electronic device, the insulating support comprising an envelope made of dielectric material which forms the outer limits of a cavity filled with a phase change material, where the method comprises steps for:

a) formation of an insulating support comprising an envelope of dielectric material defining a cavity, one or more openings being formed in the envelope so as to allow access to the cavity.

b) filling the cavity using a phase change material introduced by means of one of said openings.

According to one implementation possibility of the method, the cavity formed in step a) may be filled with a sacrificial material that is removed between step a) and step b), then it is replaced in step b) by the phase change material.

The use of a sacrificial material allows the shape of the cavity to be maintained during the creation of the DBC structure, whilst avoiding exposing the phase change material to any steps in the method which require a significant thermal budget.

According to one implementation possibility, step a) may also comprise the formation of one or more support columns for the envelope of dielectric material, where the column or columns extend in the cavity between the first face and a second face of the insulating support opposed to the first face.

Such columns are configured to provide mechanical support for the envelope of dielectric material, and may allow the shape of the cavity to be maintained during the manufacturing process as well as when the phase change material is in liquid form.

According to one implementation possibility, the method may comprise a step consisting of coating the interior of the cavity with a layer of thermally conductive material, in particular metallic material.

Such a metallic layer may be envisaged as being made of a material which has an affinity with the phase change material. The term "affinity" means in particular that the metal layer may be envisaged as being made of a material which exhibits good wettability with the phase change material. In this case the filling carried out in step b) is also improved.

The method may include, prior to step b), a step for the formation of openings in the dielectric envelope of the support.

According to one embodiment possibility of the method, at least one opening amongst said openings is formed through the lateral face of the insulating support. The term lateral face refers to a face which extends between the first and second face.

Alternatively or in combination, at least one opening is made which passes through the first or second face of the insulating support.

After step b) for filling with a phase change material, the method may in addition include, after step b), the formation of one or more elements for capping said openings.

The method may furthermore comprise at least one step for the formation of a conductive zone on the insulating support.

This step may be achieved by direct assembly or advantageously with the help of a PVD deposit.

BRIEF DESCRIPTION OF THE ILLUSTRATIONS

The present invention will be better understood on reading the description of example embodiments given purely as an indication and in no sense restrictively, making reference to the appended illustrations in which:

FIGS. 3A-3B show the filling of the cavity with phase change material using one or mode openings made in the dielectric envelope which forms the outer limits of this cavity.

FIG. 4 shows an alternative wherein the openings are made in the dielectric envelope and through a conductive layer arranged on an upper face of the dielectric support.

Figure 6A:
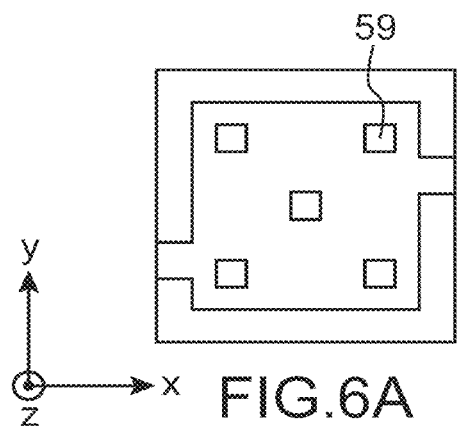
Figure 6B:
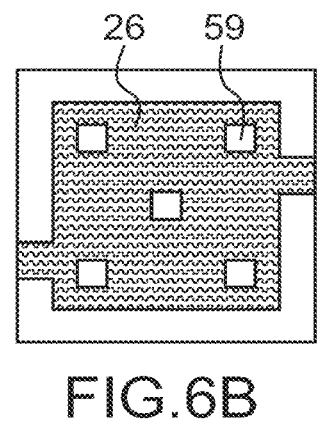
Figure 7A:
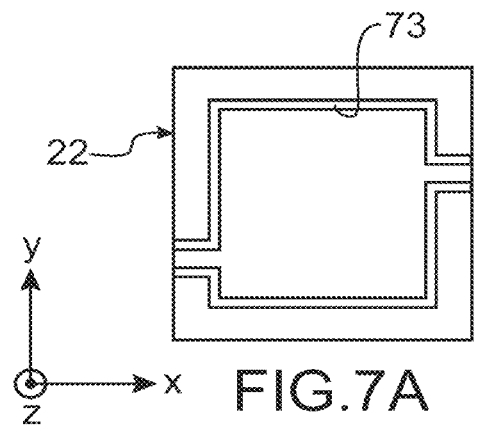
Figure 7B:
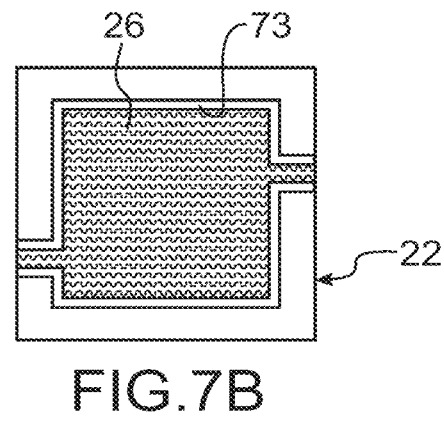
Figure 8:
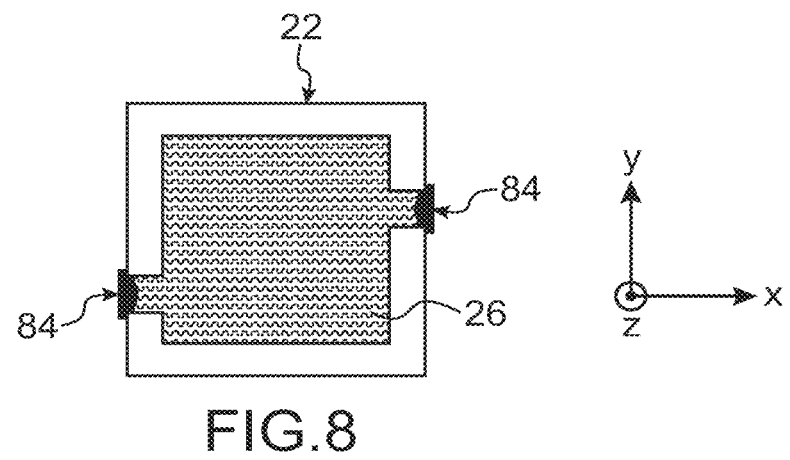

FIGS. 5A-5B show an embodiment wherein the cavity is filled with a sacrificial material which is subsequently replaced by the phase change material, FIGS. 6A-6B show an embodiment wherein mechanical support columns for the envelope of the dielectric support are provided, FIGS. 7A-7B show an embodiment wherein a fine metal layer lines the internal walls of the cavity, FIG. 8 shows an embodiment wherein the caps for sealing the cavity are made in or facing openings made in the insulating envelope.

FIGS. 9A-9l show an example of a thin layer method for manufacturing a DBC structure.

Identical, similar or equivalent portions of the various figures have the same numerical references, to make it easier to go from one figure to another.

In order to make the figures more readable, the various parts shown in the figures are not necessarily shown at a uniform scale.

Furthermore, in the description hereafter, terms which depend on the orientation, such as "under", "on", "above", upper", "lower", "lateral" etc. for a structure are applied assuming that the structure is oriented in the manner shown in the figures.

DETAILED DESCRIPTION OF PARTICULAR EMBODIMENTS

Figure 1:
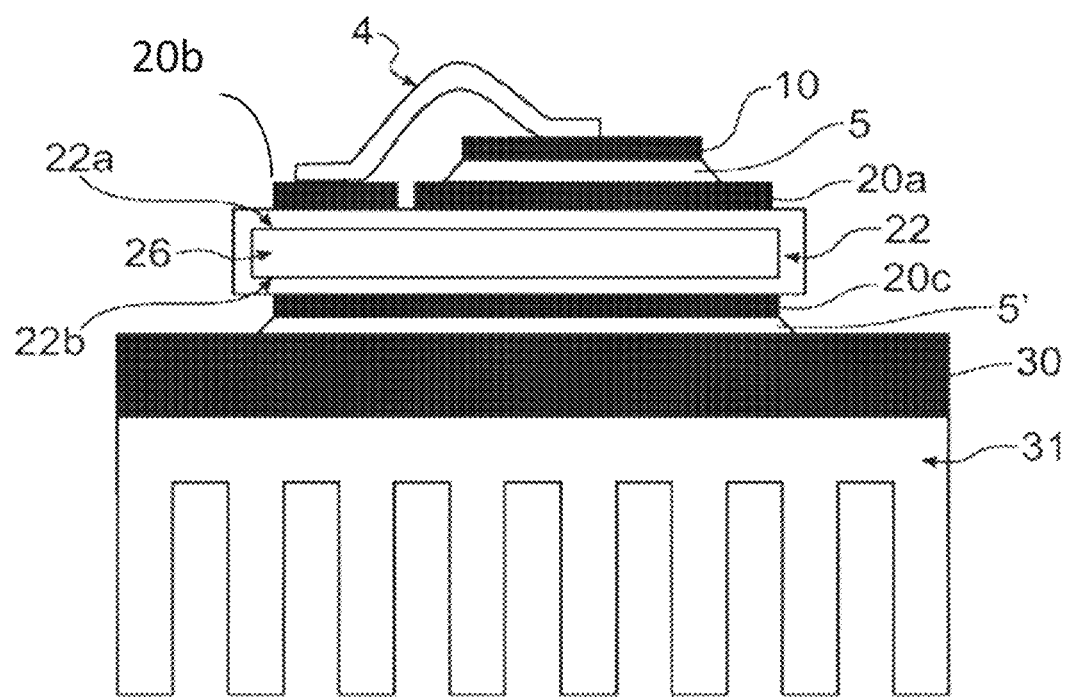
FIG. 1 shows an example of a DBC type structure implemented according to one embodiment of the present invention and comprising a dielectric support, inside which a cavity filled with a phase change material is made.

Reference will be made first of all to FIG. 1, wherein a connection and heat dissipation structure of the DBC ("Direct Bonded Copper") type is shown.

The DBC structure is connected to an electronic device 10 which is liable to undergo transitory temperature rises, which it is sought to limit. The electronic device 10 may in particular be a chip or a power circuit, or be equipped with at least one active electronic component i.e. capable of increasing the power of a signal. For example, the electronic device 10 may be equipped with thyristor(s) of the GTO ("Gate Turn-Off Thyristor") type or transistors of the IGBT ("Insulated Gate Bipolar Transistor") transistor type or thyristors of the IGCT thyristor ("Integrated Gate-Commutated Thyristor") type or with MOSFET technology transistor(s) made on a substrate.

The DBC structure comprises an insulating support 22 coated with at least one first conductive zone 20a on which the electronic device is arranged. The electronic device 10 may be attached to form one piece with the first conductive zone 20a for example by means of a soldering material 5 and may be electrically connected to a second conductive zone 20b by means of at least one conductive component such as, for example, a metal wire 4. The first and second conductive zones 20a, 20b are arranged on and in contact with a face 22a of the insulating support 22 which shall be called the "front face" 22a or "upper face" 22a.

In this embodiment example, a third conductive zone 20c is arranged on and in contact with a face 22b of the insulating support 22 opposed to said upper face lower, and which shall be called the "rear face" 22b or "lower face" 22b.

The third conductive zone 20c is attached to a heat dissipation component 31. This heat dissipation component 31 may be formed for example of a plurality of fins, spaced apart and which form a non-zero angle, for example 90°, with the lower and upper faces of the insulating support 22. As an alternative, another heat dissipation component structure 31 may be envisaged, for example a fluid channel structure extending parallel to the lower face 22b of the support 22. The heat dissipation component 31 may be attached so as to form a single part with the conductive zone 2c by means of soldering material 5'.

In order to ensure the mechanical strength of the assembly, a mechanical support 30 may also be envisaged between the third conductive zone 20c and the heat exchanger 31. The support layer or "base plate" may be a metal layer made for example of copper or of aluminium.

The upper and lower faces of the structure may have a surface area for example of between several hundred $mm^2$ and several hundred $cm^2$.

In order to provide increased thermal protection for the electronic device 10, the insulating support 22 of the DBC structure is here formed of an envelope or enclosure made of dielectric material which forms the outer limits of a cavity 25 (see FIG. 3A). This cavity 25 is filled with a phase change material 26 (see FIG. 3B). Preferably, the phase change material 26 has a fusion temperature found within a normal operating range of the electronic device 10.

The dielectric material of the support 22 may be, for example, Si3N4, or advantageously a ceramic material such as alumina or AlN.

The PCM material 26 encapsulated within the cavity 25 may be chosen so as to possess a solid/liquid phase change temperature of between, for example, 20° C. and 250° C.

The PCM material 26 may also have a latent heat greater than 20 kJ/kg, a specific heat capacity (by mass) greater than 100 J/K/kg, and a thermal conductivity greater than 10 W/m/K. The phase change material 26 (PCM) may be for example Ga, or In or an alloy such as for example $In_{97}$—$Ag_3$, or $Bi_{58}$—$Sn_{42}$, or $In_{52}$—$Sn_{48}$. The PCM material 26 surrounded by the dielectric envelope of the support 22 allows any peaks in the heat emitted by the electronic device 10 to be smoothed.

Preferably, the cavity 25 is completely filled with the phase change material 26. Advantageously, the outer limits of the cavity 25 formed by the dielectric envelope have dimensions which allow a significant volume of the phase change material 26 to be contained. In particular, the cavity 25 is envisaged as having a height H of between, for example, 0.05 mm and 1.5 mm (measured parallel to the z axis of an orthogonal reference [O; x; y; z] given in FIG. 1) which is altered as a function of a predetermined thickness of the PCM material in order to achieve a given level of heat dissipation. Thus, depending on the level of the smoothing that is sought, the thickness or height of the PCM material 26 is altered, together with the type of PCM material selected.

The thickness of the PCM material 26 in the cavity can be determined in particular as a function of the heat released by the electronic device when it is in steady-state operation. Preferably, the thickness of the PCM material 26 is limited so that the heat dissipation component 31 can carry out its dissipation function at a steady state.

The table below give characteristic thicknesses for various PCM materials 26.

| PCM Material | Thermal conductivity (W/m/K) | Coefficient of thermal expansion (1/K) | Density (g/cm3) | Thickness (mm) |
| --- | --- | --- | --- | --- |
| AlN | 170 | 4.2 | 3.26 | 0.64 |
| Si3N4 | 70-90 | 3.4 | 3.2 | 0.32 |
| Al2O3 | 24 | 7.1 | 3.7 | 0.25-0.6 |

It may be arranged that the thickness of the PCM material 26 to be introduced into the cavity is determined such that the thermal resistance of the support 22 filled with this PCM material 26 is equivalent, at a steady state, to that of a conventional DBC structure wherein the support is simply a layer of dielectric material.

The thickness of PCM material 26 may be for example between 100 μm and 7500 μm, in particular between 750 μm and 7500 μm.

In a transitional heat release state of the electronic device 10, the thermal smoothing achieved with such a PCM material 26 structure is greater than with a conventional DBC structure. In effect the latent heat of the phase change material comes into play in storing energy and therefore in thermal damping. Consequently, a PCM material 26 is chosen which has a high latent heat, for example greater than 20 kJ/kg.

Advantageously, the dielectric envelope of the support 22 is distributed such that the lower face 22a, the upper face 22b and the lateral faces 22c linking the lower face 22a and the upper face 22b are made of the same dielectric material. Thus, due to the continuity of the material between the faces 22a, 22b and 22c the latter have similar thermo-physical properties. This allows encapsulation of the phase change material 26 to be carried out whilst avoiding delamination effects. Such an effect could possibly occur under certain conditions if the upper face 22a or the lower face 22b were to be replaced by a closure layer having thermo-physical properties which are different from those of the rest of the dielectric envelope.

Figure 2A:
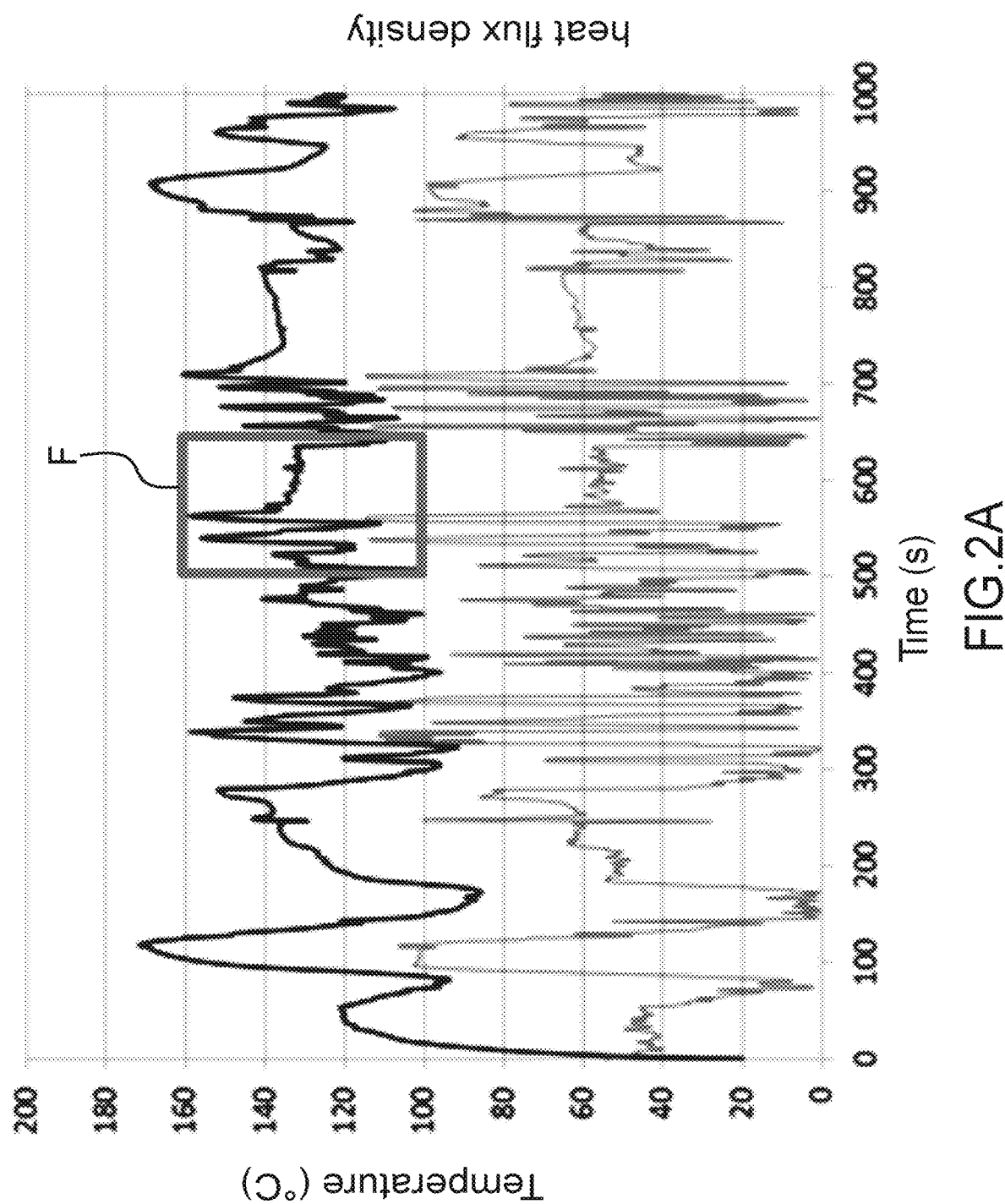
FIGS. 2A-2B show the temperature response of a design equipped with such a structure following sudden overheating, for different thicknesses of the phase change material in the cavity.
Figure 2B:
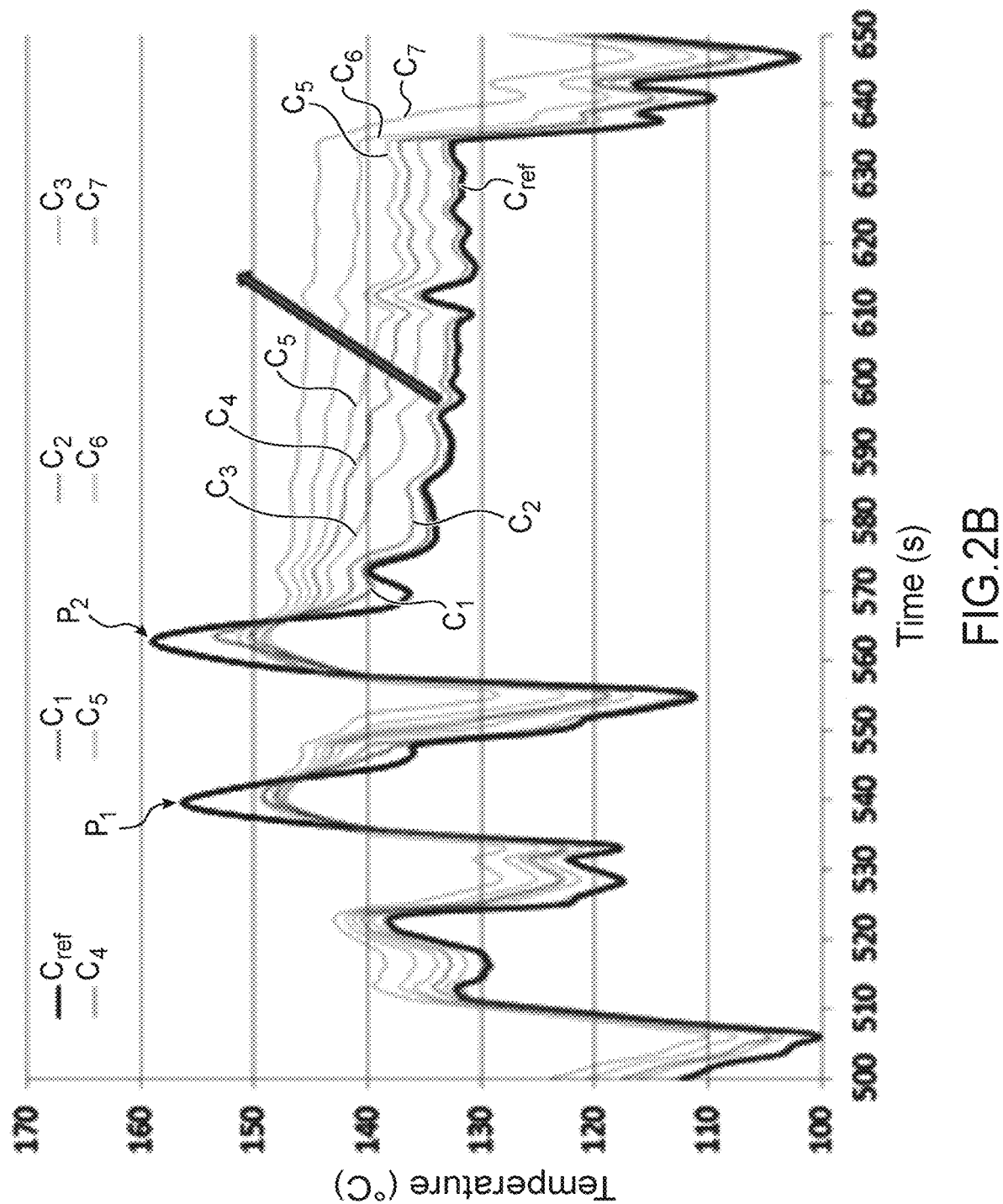

The thermal behaviour of a device using a DBC structure of the same type as described in relation to FIG. 1 is shown in FIG. 2B, with this figure giving examples of temperature curves in a selected time-window F with a thermal flux as shown in FIG. 2A.

FIG. 2B shows different temperature curves $C_1$, $C_2$, $C_3$, $C_4$, $C_5$, $C_6$, $C_7$ for different structures with respective thicknesses of phase change materials of the order of 750 μm, 1200 μm, 2500 μm, 3500 μm, 4200 μm, 5500 μm, 7500 μm. The curve $C_{ref}$ represents, for comparison purposes, the temperature behaviour of a conventional DBC structure which is not equipped with a cavity filled with a phase change material. As peaks $P_1$, $P_2$ show, the previously described structure limits sudden rises in temperature better.

To fill the cavity 25 with phase change material 26 during the manufacture of a DBC structure as described above, one or more openings are envisaged in the dielectric material envelope of the support 22. The openings may have a width Δ for example of the order of a few tens or hundreds of micrometres. The term width means the smallest dimension measured parallel to the envelope of dielectric material.

In the embodiment example in FIG. 3A in which a cavity is shown from a top view, openings 40a, 40b are made in the lateral faces 22c of the insulating support, for example by laser drilling.

The cavity is filled by introducing the PCM material 26 through at least one of these openings (FIG. 3B). This filling is carried out when the PCM material 26 is in liquid form, that is, in an environment at a temperature which brings the PCM material 26 to above its melting point. Once the PCM material 26 is raised to a temperature above its melting point, filling is carried out. Filling may be carried out, for example, by pressurisation or by formation of a negative pressure using a pumping system, or simply under gravity.

As an alternative or in combination, transverse openings 40c, 40d may also be envisaged in the upper face or the lower face of the support 22. In the particular example shown in FIG. 4, the openings 40c, 40d also pass through a conductive zone 20a placed in contact with the upper face of the dielectric support 22. The openings 40c, 40d may in this case have been made after assembly of the conductive zone 20a with the dielectric support 22.

Steps at very high temperatures, for example above 1000° C., such as pressurisation of the bands of dielectric material, annealing, binder removal, fritting, and deposition may be carried out in order to make the DBC structure.

During the method for manufacturing the DBC structure, in order to overcome any problems involving creep of the dielectric envelope, and to avoid sinking or deformation of the cavity occurring, a means of support may be envisaged inside the cavity.

According to one embodiment possibility for this means of support, a sacrificial material 69 is introduced into the cavity (FIG. 5A).

The sacrificial material 69 may be a material capable of undergoing decomposition, destruction or solution at a high temperature, for example above 250° C., and/or capable of being selectively etched relative to the dielectric material forming the envelope of the cavity 25. The sacrificial material 69 may be for example made of a photosensitive resin or carbon-based.

Then the sacrificial material 69 is replaced by the phase change material 26 (FIG. 5B).

The fact that such a sacrificial material 26 is envisaged during the manufacturing method for the DBC structure also means that the phase change material 26 is not subjected to steps which could cause it to degrade, in particular steps during which a significant rise in temperature is used.

As an alternative or in combination, one or more support columns 59 could be envisaged, as shown in FIG. 6A-6B, in order to create a means of maintaining the shape of the cavity 25 during the creation of the DBC structure.

The columns 59 extend in the cavity 25 between the lower face and the upper face of the support 22 and may be made from the same dielectric material as that of the dielectric envelope.

One example of a method for making the insulating support 22 comprises the creation by casting of one or more bands of dielectric material which may then be cut up by laser then stacked. Alternatively, a stack is made by assembly and then cut up by laser for example. The assembly step may be carried out under pressure for example at between 0.1 and 10 MPa, at a temperature between ambient temperature and 100° C. over a period which may last for example of several tens of minutes.

Pressing steps to join the bands so that they form a single part using a binder, for example PEG (polyethylene glycol) or PVB (polyvinyl butyral), then removal of the binder, may also be carried out. A fritting step whose purpose is to consolidate the stack by providing thermal energy may also be carried out.

This step may be carried out under load. During the fritting step, the assembly of bands may be brought to a temperature which could reach over 1000° C. In order to create the cavity 25, it is possible to use a stacking method comprising a technique commonly called LTCC (low temperature co-fired ceramic) or HTTC (high temperature co-fired ceramic), the LTTC technique generally being carried out for temperatures below 1000° C., whereas the HTCC technique is carried out for temperatures around 1600° C.-1700° C.

As indicated earlier, a means of mechanical support such as a sacrificial material in the cavity 25 and/or columns in the cavity 25 may be envisaged in order to prevent sinking of the dielectric envelope forming the cavity 25 during the steps for assembly of the base ceramic sheets and/or fritting.

For making the entry/exit opening(s) 40a, 40b, 40c, 40d in the dielectric envelope of the support 22, drilling may then be carried out, for example using a laser.

Assembly on the dielectric support 22 of layers wherein the conductive zones 20a, 20b, 20c are envisaged may, for its part, be carried out, for example, using direct assembly When the conductive zones 20a, 20b, 20c are copper-based and the support material 20 made of ceramic material, assembly, for example, of the type described in: "Eutectic bonding of copper to ceramics for thermal dissipation applications", by Tuan et al., a review Journal of the European Ceramic Society 34(2014) 4117-4130 may be envisaged. In this case, oxidation of a layer of copper is carried out, then a zone of oxidised copper (CuO) is brought into contact with a ceramic material such as for example $Al_2O_3$ at a temperature for example of the order of 1065° C. for a period for example the order of 3 min in order to form a compound $CuAl_xO_y$ used to bind the ceramic of the support to the copper of the conductive zone.

Filling of the cavity 25 with phase change material 26 may only be carried out once the dielectric support 22 has been coated with one or more conductive layers or zones, 20a, 20b, 20c advantageously made of copper.

In this case filling is carried out by means of lateral openings as in the example shown in FIGS. 3A-3B and/or transverse openings passing through a conductive zone as in the example in FIG. 4.

In order to improve filling of the cavity with the phase change materials 26, prior to this filling (FIG. 7A), lining of the internal walls of the cavity 25 with a thin layer 73 called a "liner" may be envisaged, this liner being based on a material which exhibits an affinity with the phase change material 26. The liner 73 may be made of a metallic material such as for example tin, or titanium or gold, which exhibits an affinity with a metallic phase change material 26.

This liner 73 may be made for example by PVD (physical vapour deposition) type or CVD (chemical vapour deposition) type deposition, or by evaporation or by a MOCVD (metalorganic chemical vapour deposition) technique.

More generally, a liner 73 made of a material such as a metallic material which has good thermal conductivity properties may be arranged against the dielectric envelope inside the cavity 25, in order to allow better heat distribution around the phase change material (FIG. 7B).

After filling of the cavity (25) with the phase change material 26, the openings used for filling may be capped, as shown in FIG. 8. Thus caps 84 are made located facing and/or in the openings. The caps may be made for example of a polymer material.

A DBC type structure as described above may also be made using a manufacturing method using thin layers as shown for example in FIGS. 9A-9J.

Figure 9A:
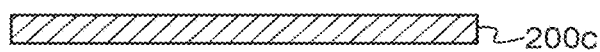

In the example in FIG. 9A, a conductive layer 200c, for example made of copper, is used as a starting substrate. This conductive layer 200c may also for example be intended to receive the heat dissipation component 31 of the DBC structure.

Then (FIG. 9B) onto this substrate one of more layers of dielectric material 210 is deposited, for example of $Si_3N_4$, or made of ceramic material such as AlN or $Al_2O_3$, wherein it is intended to form the insulating support of the DBC structure.

Then (FIG. 9C) a cavity 215 is made in the layer or layers of the dielectric material 210. This cavity 215 can be made by etching through an opening in a mask 218 formed on the dielectric material 210. The etching may be carried out using plasma, in particular of the RIE (reactive ion etching) type or by a wet process using a chemical bath. In the case where the dielectric material is AlN, the chemical bath may be for example based on KOH. Alternatively, the cavity 215 may be formed using a lift-off type method, wherein first of all full-plate deposition of a photosensitive resin is performed on a conductive layer 200c. Then this layer is only exposed on the edges by protecting the central part using a mask, and then the exposed resin is removed using a chemical bath.

Then a dielectric 210 based on for example AlN, or $Si_3N_4$ is deposited.

Then the remaining unexposed resin is removed using for example an acetone bath, which does not dissolve the dielectric material.

Figure 9E:
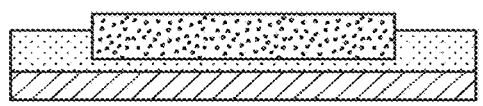
Figure 9B:
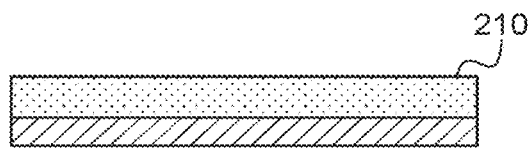
Figure 9F:
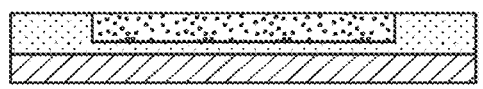
Figure 9C:
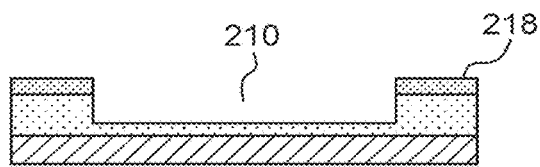
Figure 9G:
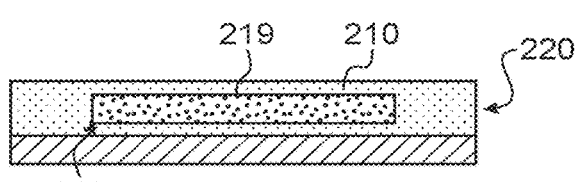
Figure 9D:
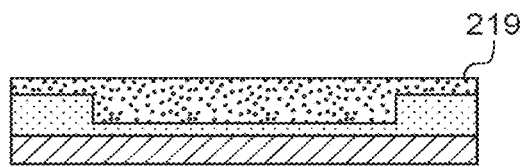
Figure 9H:
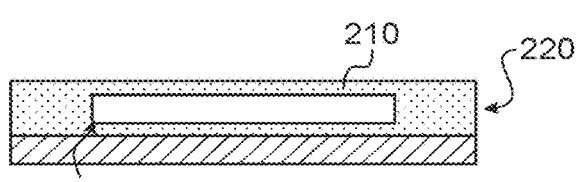

Once the cavity 215 has been made, a sacrificial material 219 is deposited in it (FIG. 9D). The sacrificial material 219 may be photosensitive material capable of being etched or chemically dissolved. A photosensitive resin, for example of the S1818™, S1828™, SU8™ type may be envisaged as a sacrificial material formed for example by spin coating.

Steps for removing the etching mask 218, then of portions of the excess sacrificial material 21 spilling over into the opening of the cavity 215 may then be carried out (FIGS. 9E and 9F).

Then the cavity 215 is closed by the deposition of at least one additional layer of the dielectric material 210 (FIG. 9G).

Then lateral and/or transverse (not shown) openings for accessing the cavity 215 may be made by drilling the dielectric material, in particular using a laser or by photolithography.

Then the sacrificial material 219 is removed from the cavity 215. In order to do this, the assembly can, for example be, immersed in a chemical bath such as, for example, MF319™ or PGMEA (2-methoxy-1-methylethylacetate) in order to dissolve the photosensitive resin.

Filling of the cavity 215 may then be carried out by dispensing a phase change material 226 which has been brought to a temperature above its melting temperature.

Figure 9I:
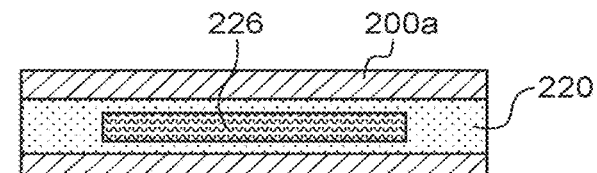

Then a conductive zone 200a based, for example, on copper is formed on the support 220 of dielectric material 210 (FIG. 9I). This other conductive zone 220a is arranged on a face of the support opposed to that on which the conductive zone 200c, used as the starting substrate, is located. The conductive zone 220a may be made for example using PVD deposition. Such a technique may advantageously be carried out at ambient temperature, thus avoiding subjecting the structure containing the phase change material 226 to an excessively high temperature.

The use of the conductive zone 220a as a zone for closure of the openings, made in the envelope of dielectric material 210 for filling the phase change material, may be envisaged, in particular when these openings are transverse openings made on the upper face of the dielectric support.

In an alternative to the embodiment example described above in relation to FIGS. 9G-9I, a conductive zone 200a is assembled on the dielectric material support 210 before filling the cavity with the phase change material 226. In this case, capping of the filling openings using caps formed facing the openings or in the openings may be carried out.

The invention claimed is:

1. A structure for connection and for dissipation of the heat produced by an electronic device, comprising an insulating support, the insulating support being coated with:
   at least one conductive zone, made of copper, arranged on and in contact with a first face of the insulating support, the conductive zone being configured to receive an electronic device,
   at least one other conductive zone, made of copper, arranged on and in contact with a second face of the insulating support opposed to the first face, the other conductive zone being configured to receive a heat exchanger,
   the insulating support further comprising an envelope of dielectric material, which is a ceramic material, which defines a closed cavity, the cavity being filled with a phase change material, and the insulating support surrounding the closed cavity such that said first face, said second face and lateral faces connecting said first face and said second face are made of the same dielectric material,
   the at least one conductive zone and the at least one other conductive zone are not in direct contact with or exposed to the cavity, and the at least one conductive zone and the at least one other conductive zone being bound to the insulating support based on a binding of the copper of each of the at least one conductive zone and the at least one other conductive zone with the ceramic material of the insulating support via a compound formed from oxidized copper and the ceramic material.

2. The structure according to claim 1 further comprising one or more support columns for the envelope of dielectric material, the one or more support columns extending in the cavity between the first face and the second face of the insulating support.

3. The structure according to claim 1, wherein the envelope of dielectric material is coated inside the cavity by a layer made of thermally conductive material.

4. The structure according to claim 1, wherein the dielectric material is one of $Si_3N_4$, AlN, and $Al_2O_3$.

5. The structure according to claim 1, wherein openings are provided through the envelope of dielectric material, said openings being closed by caps facing the openings or arranged in the openings.

6. A structure for connection and for dissipation of the heat produced by an electronic device, comprising an insulating support, the insulating support being coated with:
   at least one conductive zone, arranged on and in contact with a first face of the insulating support, the conductive zone being configured to receive an electronic device,
   at least one other conductive zone, arranged on and in contact with a second face of the insulating support opposed to the first face, the other conductive zone being configured to receive a heat exchanger,
   the insulating support further comprising an envelope of dielectric material, which is a ceramic material, which defines a closed cavity, the cavity being filled with a phase change material, and the insulating support surrounding the closed cavity such that the envelope of dielectric material is arranged such that said first face, said second face, and lateral faces of the insulating support connecting said first face and said second face are made of the same dielectric material, openings being provided through said lateral faces, said openings being closed by caps facing the openings or arranged in the openings,
   the at least one conductive zone and the at least one other conductive zone are not in direct contact with or exposed to the cavity.

7. The structure according to claim 6, wherein said conductive zone and said one other conductive zone are made of copper, said dielectric material of said envelope is a ceramic material, and the at least one conductive zone and said one other conductive zone being bound to the insulating support based on a binding of the copper of each of the at least one conductive zone and the at least one other conductive zone with the ceramic material of the insulating support via a compound formed from oxidized copper and the ceramic material.

8. The structure according to claim 6, the envelope of dielectric material further comprising one or more support columns, the one or more support columns extending in the cavity between the first face and the second face of the insulating support.

9. The structure according to claim 6, wherein the envelope of dielectric material is coated inside the cavity by a layer made of thermally conductive material.

10. The structure according to claim 6, wherein the dielectric material is one of $Si_3N_4$, AlN, and $Al_2O_3$.

11. A system comprising:
an electronic device,
a heat exchanger,
a structure for connection and for dissipation of the heat produced by the electronic device, comprising an insulating support, the insulating support being coated with:
at least one conductive zone, arranged on and in contact with a first face of the insulating support, the conductive zone being configured to receive the electronic device,
at least one other conductive zone, arranged on and in contact with a second face of the insulating support opposed to the first face, the other conductive zone being configured to receive said heat exchanger,
the insulating support further comprising an envelope of dielectric material, which is a ceramic material, which defines a closed cavity, the cavity being filled with a phase change material, and the insulating support surrounding the closed cavity, said envelope being arranged such that said first face, said second face and lateral faces of the support connecting said first face and said second face are made of the same dielectric material, wherein openings are provided though said envelope, said openings being closed by caps facing said openings or arranged in said openings,
the at least one conductive zone and the at least one other conductive zone are not in direct contact with or exposed to the cavity.

12. The structure according to claim 11, wherein said openings are provided in said lateral faces of the insulating support.

* * * * *